United States Patent
Chen et al.

(10) Patent No.: US 11,612,050 B2
(45) Date of Patent: Mar. 21, 2023

(54) HEAT DISSIPATION DEVICE

(71) Applicant: GIGA-BYTE TECHNOLOGY CO., LTD., New Taipei (TW)

(72) Inventors: Hung-Cheng Chen, New Taipei (TW); Tse-Hsien Liao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 259 days.

(21) Appl. No.: 17/113,113

(22) Filed: Dec. 7, 2020

(65) Prior Publication Data
US 2021/0274640 A1 Sep. 2, 2021

(30) Foreign Application Priority Data
Feb. 27, 2020 (TW) .................... 109106604

(51) Int. Cl.
*H05K 1/02* (2006.01)
*H05K 7/20* (2006.01)

(52) U.S. Cl.
CPC ......... *H05K 1/0209* (2013.01); *H05K 1/0204* (2013.01); *H05K 7/205* (2013.01); *H05K 7/20218* (2013.01); *H05K 7/20336* (2013.01); *H05K 7/20409* (2013.01); *H05K 2201/064* (2013.01); *H05K 2201/066* (2013.01)

(58) Field of Classification Search
CPC .............. H05K 1/0209; H05K 1/0204; H05K 7/20218; H05K 7/20336; H05K 7/20409; H05K 7/205; H05K 7/20509; H05K 7/2039; G06F 2200/201; G06F 1/20
See application file for complete search history.

(56) References Cited

U.S. PATENT DOCUMENTS

| | | | |
|---|---|---|---|
| 2005/0128710 A1 | 6/2005 | Beiteimal et al. | |
| 2008/0068805 A1 | 3/2008 | Xu et al. | |
| 2008/0291614 A1 | 11/2008 | Tatsuya et al. | |
| 2009/0223647 A1 | 9/2009 | Alousi et al. | |
| 2010/0181665 A1 | 7/2010 | Casey et al. | |
| 2010/0220447 A1 | 9/2010 | Nie et al. | |
| 2019/0269035 A1* | 8/2019 | Saturley ............... | F28D 15/00 |

FOREIGN PATENT DOCUMENTS

| | | | | |
|---|---|---|---|---|
| CN | 2819289 Y | | 9/2006 | |
| CN | 2819289 Y | * | 9/2006 | |
| CN | 208298114 U | | 12/2018 | |
| CN | 109588023 A | * | 4/2019 | ........... H01L 23/367 |

(Continued)

OTHER PUBLICATIONS

European Search Report of corresponding European Patent Application No. 20210264.6 dated Oct. 1, 2021.

(Continued)

*Primary Examiner* — Emmanuel E Duke
(74) *Attorney, Agent, or Firm* — Idea Intellectual Limited; Margaret A. Burke; Sam T. Yip

(57) ABSTRACT

A heat dissipation device includes a heat conductor. The heat conductor includes a heat dissipation side and a heat absorption side opposite to each other. The heat absorption side is formed by at least two contact planes. The at least two contact planes are arranged in parallel to each other, and a height difference exists between the at least two contact planes.

13 Claims, 10 Drawing Sheets

(56) References Cited

FOREIGN PATENT DOCUMENTS

| CN | 208820915 U | * | 5/2019 |
|---|---|---|---|
| CN | 209358903 U | * | 9/2019 |
| DE | 202007001266 U1 | | 6/2007 |
| EP | 0890986 A2 | | 1/1999 |
| EP | 2838330 A2 | | 2/2015 |
| JP | S58218148 A | | 12/1983 |
| WO | 2014132086 A1 | | 9/2014 |
| WO | 2015071920 A1 | | 5/2015 |

OTHER PUBLICATIONS

Partial European Search Report of corresponding European patent application No. 20210264.6 dated Jun. 1, 2021.

\* cited by examiner

HEAT DISSIPATION DEVICE

CROSS-REFERENCE TO RELATED APPLICATION

This non-provisional application claims priority under 35 U.S.C. § 119(a) to Patent Application No. 109106604 filed in Taiwan, R.O.C. on Feb. 27, 2020, the entire contents of which are hereby incorporated by reference.

BACKGROUND

Technical Field

This disclosure relates to the heat dissipation of electronic devices, and in particular, to a heat dissipation device that can be simultaneously in contact with a plurality of heating elements of different heights.

Related Art

A circuit board with complex functions, for example, a graphics card and a motherboard, usually have a plurality of chips that easily generate heat. Taking the motherboard an example, besides a CPU with a high thermal power, chips such as power chips, on-board memory chips, on-board graphics chips, and the like with high thermal power may be disposed around the CPU. Since heights of these chips are different, it is necessary to dispose a plurality of heat sinks to contact the chips of different heights, to dissipate heat for different chips.

When the chips are densely arranged, the adjacent space between the chips is reduced accordingly. In this case, fixing structures between different heat sinks are likely to interfere with each other, which cause the heat sinks to be redesigned according to the arrangement of the chips. In addition, plural heat sinks arranged densely cause the assembly procedure to become complicated and affect the assembly efficiency.

SUMMARY

In view of the above problems, this disclosure provides a heat dissipation device for simultaneously satisfying heat dissipation requirements of a plurality of heating elements.

This disclosure proposes a heat dissipation device, including a heat conductor. The heat conductor includes a heat dissipation side and a heat absorption side opposite to each other. The heat absorption side is formed by at least two contact planes, the at least two contact planes are arranged in parallel to each other, and a height difference exists between the at least two contact planes.

In at least one embodiment, the heat dissipation device further includes a plurality of heat-conducting medium respectively disposed on one of the at least two contact planes, and the plurality of heat-conducting medium are deformable.

In at least one embodiment, the heat dissipation device further includes a heat dissipation structure disposed on the heat dissipation side.

In at least one embodiment, the heat dissipation structure is a water cooled heat sink, a plurality of heat dissipation fins, or a heat pipe.

In at least one embodiment, the heat dissipation device further includes a heat pipe with one end of the heat pipe disposed in the heat conductor.

In at least one embodiment, the at least two contact planes are capable to move relative to each other, to change the height difference.

In at least one embodiment, the heat conductor includes at least two blocks, the at least two blocks respectively correspond to one of the at least two contact planes, and the at least two blocks are connected through a sliding guide structure, so as to move relative to each other to change the height difference.

In at least one embodiment, the at least two blocks respectively includes a joint surface, the at least two joint surfaces are in contact with each other, the sliding guide structure is a combination of a guide groove and a guide rail, the guide groove and the guide rail are respectively disposed on each of the joint surfaces of the at least two blocks, and directions in which the guide groove and the guide rail extend are perpendicular to the at least two contact planes.

In at least one embodiment, the at least two blocks are respectively a water cooled heat sink and the at least two blocks are connected by at least a pipeline.

In at least one embodiment, the heat dissipation device further includes a heat-conducting member having two ends respectively connected to the at least two blocks.

In at least one embodiment, the heat dissipation device further includes at least two bumps respectively disposed on the at least two contact planes, and at least one of the at least two bumps is detachable.

In at least one embodiment, one of the at least two contact planes includes a positioning dent configured to position the bump which is detachable.

In at least one embodiment, the heat dissipation device further includes a plurality of fixing members passing through the heat conductor.

In at least one embodiment, the heat dissipation device further includes a back plate and a plurality of fixing members, wherein the back plate is connected to the heat absorption side through the plurality of fixing members, and the back plate is spaced apart from the heat absorption side.

The heat sink of this disclosure has a plurality of contact planes of different heights, and may be respectively in contact with heating elements of different heights. Therefore, the heat sink of this disclosure can easily achieve the effect of heat dissipation by a plurality of heating elements at the same time. In at least one embodiment, according to this disclosure, through different structural changes, a first height difference between the contact planes and a second height difference between the heating elements are compensated, further solving the problem that the first height difference and the second height difference cannot be matched due to manufacturing tolerances or heating elements being replaced with heating elements of different specifications.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
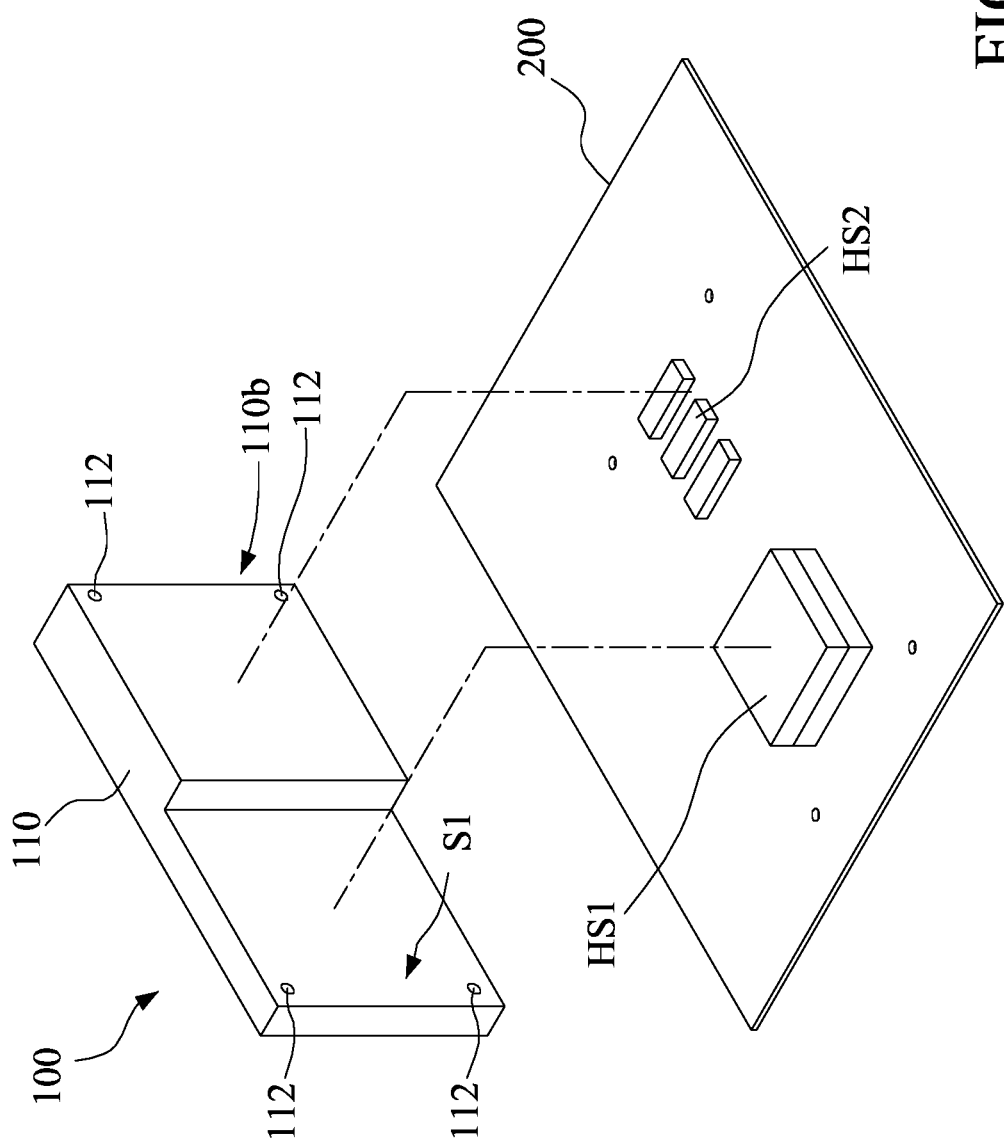
FIG. 1 is a three-dimensional view of a heat dissipation device and a circuit board according to a first embodiment of this disclosure.
Figure 2:
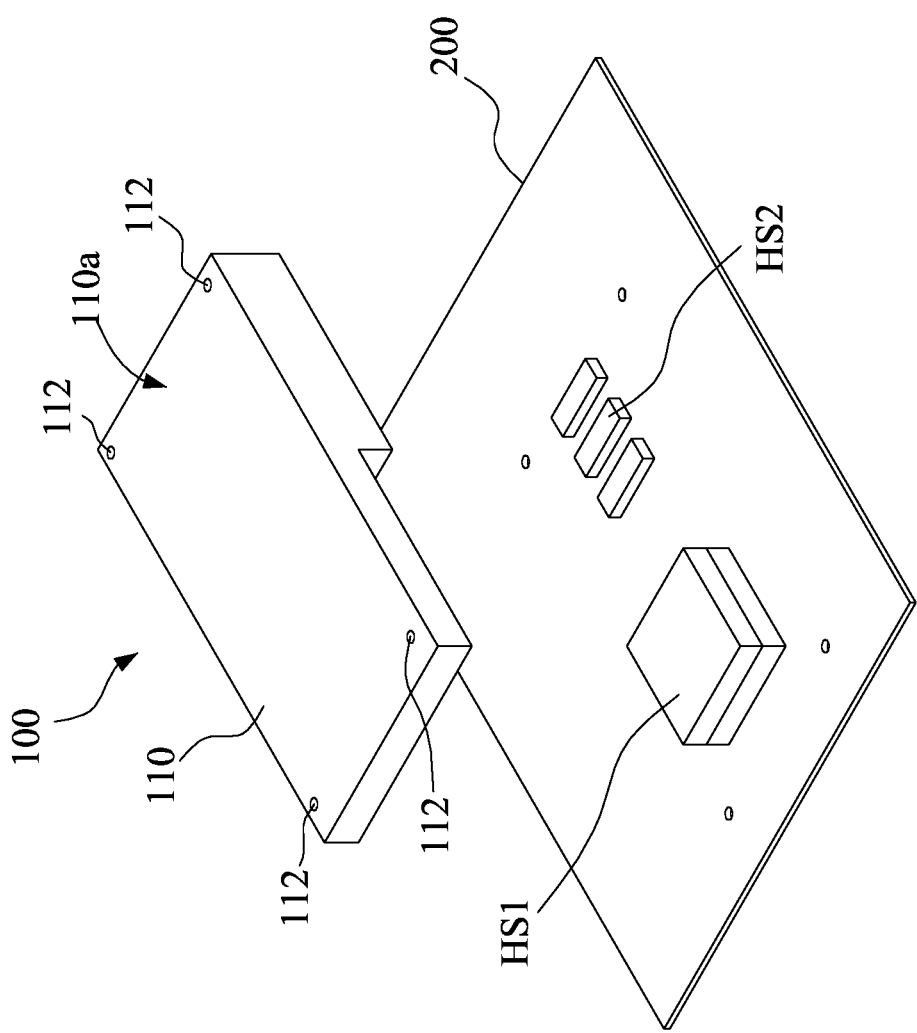
FIG. 2 is another three-dimensional view of a heat dissipation device and a circuit board according to a first embodiment of this disclosure.

Referring to FIG. 1 and FIG. 2, a heat dissipation device 100 disclosed in a first embodiment of this disclosure is shown, which is suitable for a circuit board 200 having a plurality of heating elements HS1, HS2. The plurality of heating elements HS1, HS2 have at least two different heights on the circuit board 200.

As shown in FIG. 1 and FIG. 2, the heat dissipation device 100 includes a heat conductor 110. The heat conductor 110 is made of a material with good thermal conductivity. The heat conductor 110 is usually made of metal such as copper or aluminum, and other non-metallic materials with high thermal conductivity are not excluded.

Figure 3:
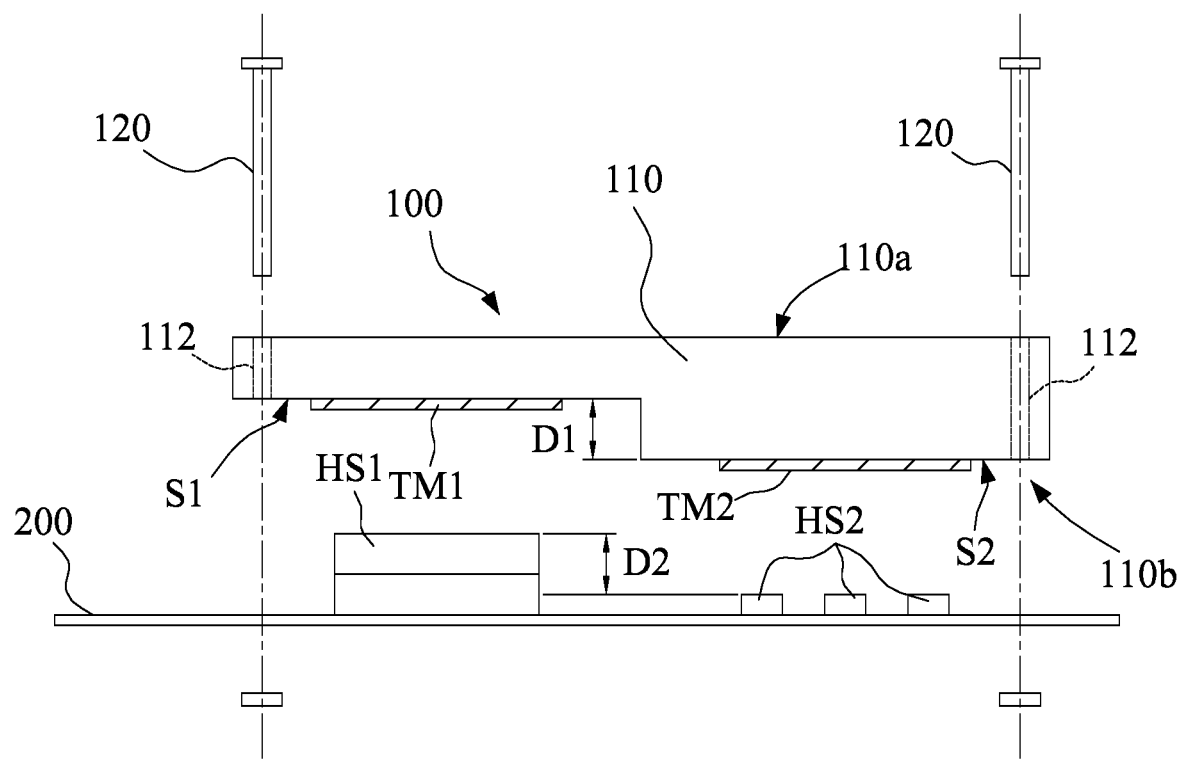
FIG. 3 is a side exploded view of a heat dissipation device and a circuit board according to a first embodiment of this disclosure.

As shown in FIG. 1, FIG. 2, and FIG. 3, the heat conductor 110 has a heat dissipation side 110a and a heat absorption side 110b. The heat absorption side 110b is formed by at least two contact planes S1, S2, the at least two contact planes S1, S2 are arranged in parallel to each other. A first height difference D1 exists between the at least two contact planes S1, S2. As shown in FIG. 2, the plurality of heating elements HS1, HS2 have two different heights on the circuit board 200. In one specific embodiment, one of the heating elements HS1, HS2 is a central processing unit (CPU), and the remaining heating elements HS1, HS2 are memory chip modules. The memory chip module is fixed onto the circuit board 200 by surface mounting or other welding techniques. The CPU and the memory chip module have different heights on the circuit board 200, and there is a second height difference D2.

Figure 4:
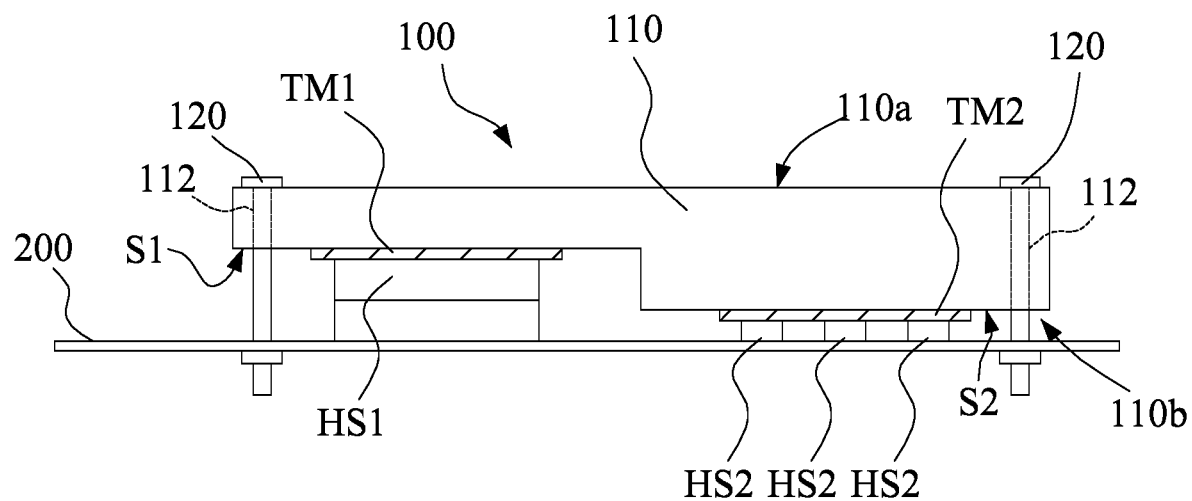
FIG. 4 is a side view of a heat dissipation device and a circuit board according to a first embodiment of this disclosure.

As shown in FIG. 3 and FIG. 4, the first height difference D1 and the second height difference D2 are similar and preferably the same. The heat absorption side 110b is respectively in contact with the heating elements HS1, HS2 of different heights with different contact planes S1, S2, so that the heat absorption side 110b can make surface contact with the heating elements HS1, HS2 of different heights at the same time, and absorb heat generated by the plurality of heating elements HS1, HS2 during operation. Generally, the same type of heating elements HS1, HS2 are concentrated in the same area for configuration. For example, after the CPU is separately arranged, a plurality of memory chip modules are concentrated in an area adjacent to the CPU for arrangement. Therefore, a single one of the contact planes S1, S2 may be in contact with a plurality of heating elements HS1, HS2 with the same height (for example, memory chip modules) at the same time, which is not limited to a single one of the contact planes S1, S2 in contact with a single one of the heating elements HS1, HS2.

As shown in FIG. 3 and FIG. 4, in order to solve the tolerance problem, that is, when differences exist between the first height difference D1 and the second height difference D2 and different, the heat dissipation device 100 further includes a plurality of heat-conducting mediums TM1, TM2. The heat-conducting mediums are respectively disposed on one of a plurality of contact planes S1, S2, so that each of the contact planes S1, S2 is in indirect contact with the heating elements HS1, HS2 through the heat-conducting medium TM1, TM2. The heat-conducting medium TM1, TM2 are deformable, for example, the heat-conducting mediums TM1, TM2 may be heat-conducting foam tapes or a heat-conducting paste. The deformable heat-conducting medium TM1, TM2 are capable to be pressed to change the thickness, to compensate the difference between the first height difference D1 and the second height difference D2, so that the plurality of contact planes S1, S2 can be reliably in contact with the heating elements HS1, HS2.

As shown in FIG. 1, FIG. 2, FIG. 3, and FIG. 4, the heat conductor 110 further includes a plurality of fixing through holes 112 penetrating the heat dissipation side 110a and the heat absorption side 110b. The fixing through hole 112 is preferably arranged near an edge of the heat conductor 110, so that the fixing through hole 112 can be in communication with different contact planes S1, S2 on the heat absorption side 110b. The heat dissipation device 100 further includes a plurality of fixing members 120 configured to pass through the heat conductor 110. The plurality of fixing members 120 pass through the fixing holes 112 and are fixed onto the circuit board 200, to fix the heat conductor 110 of the heat dissipation device 100 to the circuit board 200, and cause the heat conductor 110 to press the heating elements HS1, HS2 appropriately, thereby strengthening the contact between the contact planes S1, S2 and the heating elements HS1, HS2.

The above fixing member 120 may be directly fixed to the circuit board 200 through screw locking, or may be indirectly fixed to the circuit board 200 through the combination of other elements.

Figure 5:
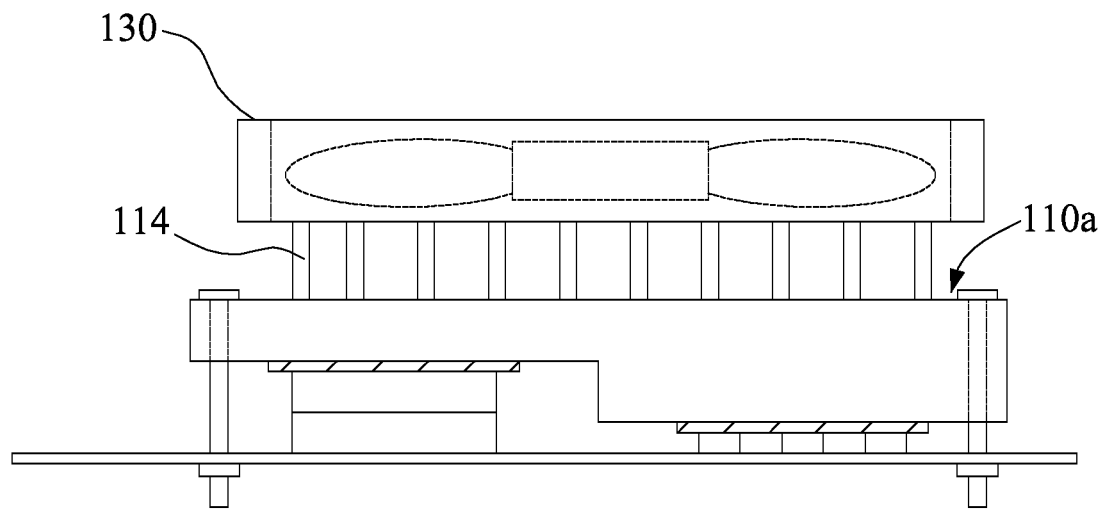
FIG. 5 to FIG. 8 are side views of a heat dissipation device and a circuit board according to a first embodiment of this disclosure, which reveal different variations.
Figure 6:
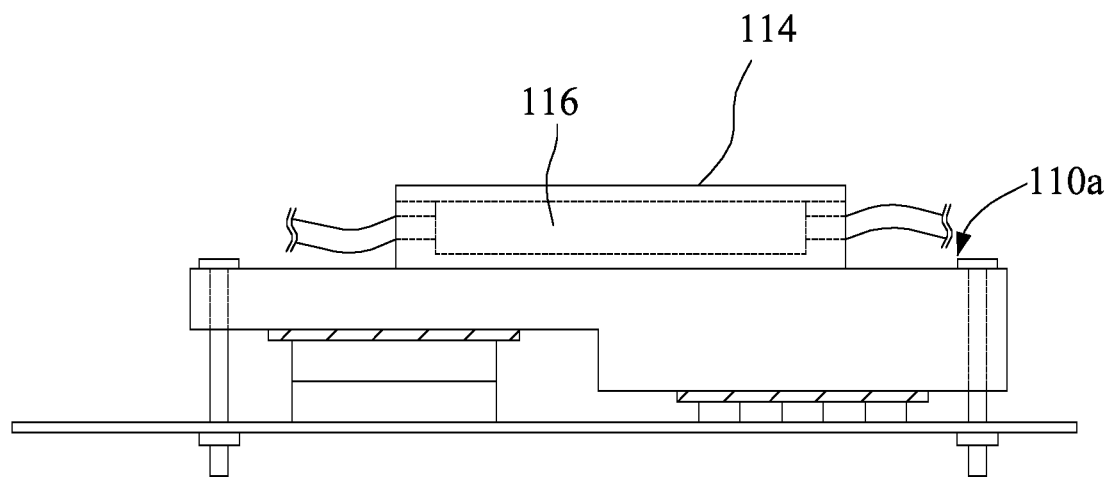
Figure 7:
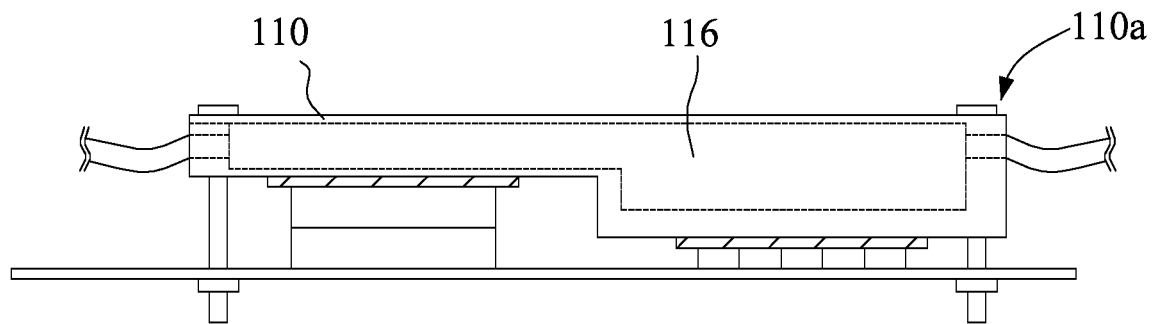

As shown in FIG. 5, FIG. 6, and FIG. 7, a heat dissipation structure 114 may be selectively disposed on the heat dissipation side 110a for cooling the heat conductor 110.

As shown in FIG. 5, the heat dissipation structure 114 may be a plurality of heat dissipation fins to cool the heat conductor 110 by air cooling. In addition to natural convection air cooling, the heat dissipation device 100 may further include a fan 130 fixed onto the heat dissipation fins, to cool the heat conductor 110 by forced air cooling.

As shown in FIG. 6, the heat dissipation structure 114 may be an external water cooled heat sink. The water cooled heat sink is fixed onto the heat dissipation side 110a. The water cooled heat sink has a cooling passage 116, and the cooling passage 116 is connected to a pump through a pipeline, to pump cooling water or other coolant liquid to circulate in the cooling passage 116, to cool the heat conductor 110.

As shown in FIG. 7, the heat conductor 110 may be directly configured to be a water cooled heat sink, and is connected to the pump by using the cooling passage 116 through a pipeline.

Figure 8:
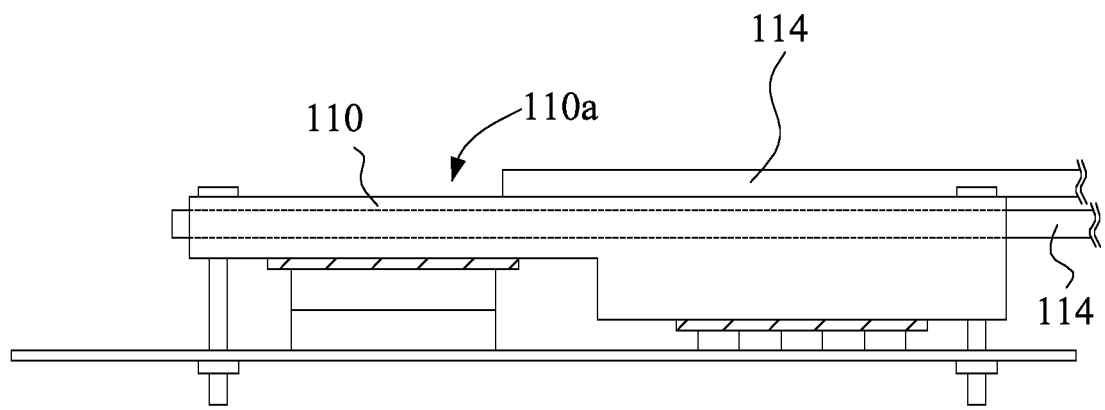

As shown in FIG. 8, the heat dissipation structure 114 may be a heat pipe, one end of the heat pipe is disposed on the heat dissipation side 110a or in the heat conductor 110, and the other end of the heat pipe is connected to a cooling unit (such as a fin assembly).

Figure 9:
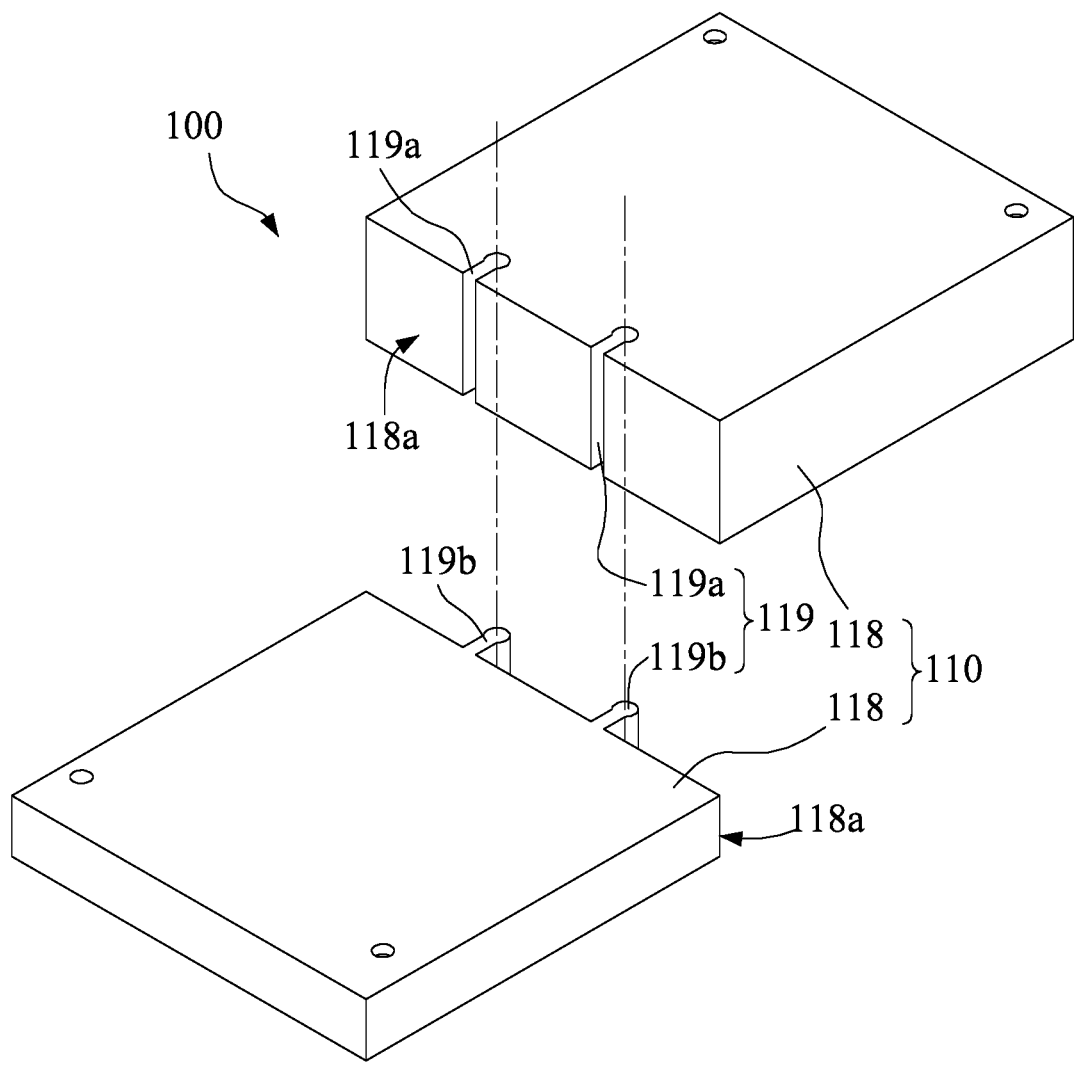
FIG. 9 is a three-dimensional view of a heat dissipation device according to a second embodiment of this disclosure.
Figure 10:
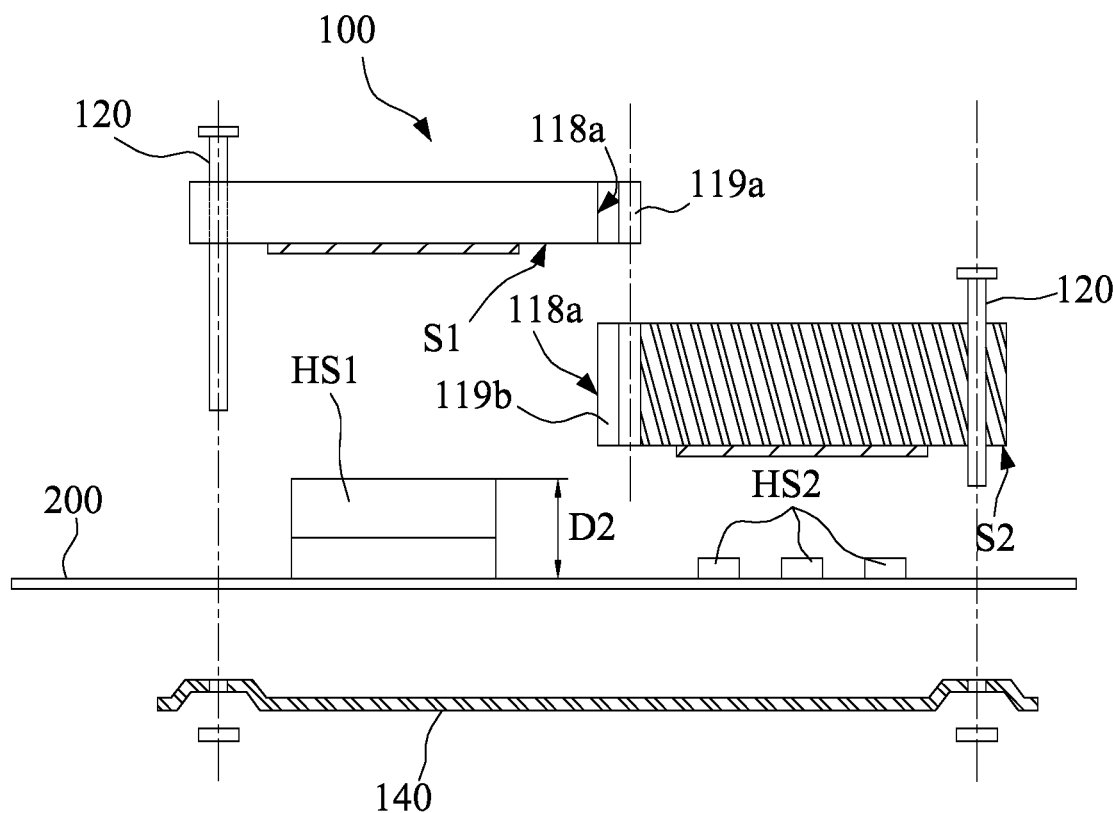
FIG. 10 is a side exploded view of a heat dissipation device and a circuit board according to a second embodiment of this disclosure.
Figure 11:
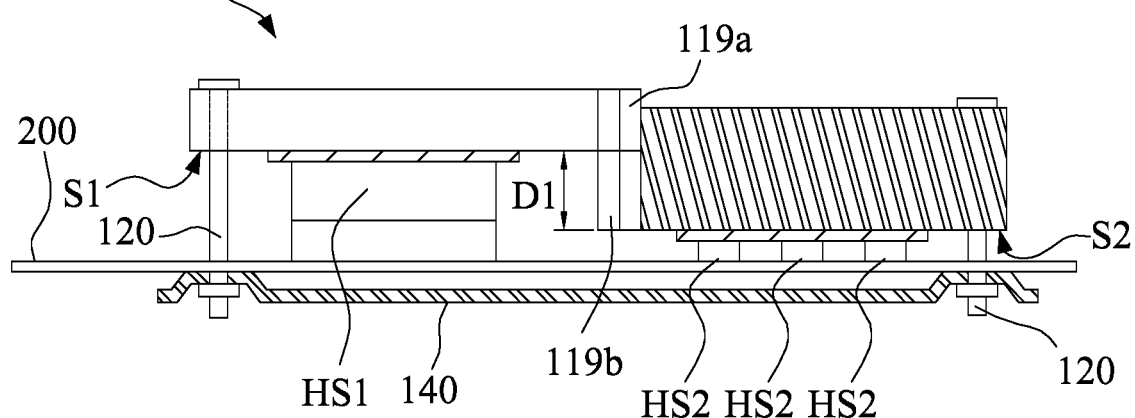
FIG. 11 is a side view of a heat dissipation device and a circuit board according to a second embodiment of this disclosure.

As shown in FIG. 9, FIG. 10, and FIG. 11, a heat dissipation device 100 disclosed in a second embodiment of this disclosure is shown. In the second embodiment, at least two contact planes S1, S2 are configured to be capable to move relative to each other, to change the first height difference D1, so that the first height difference D1 is capable to match the change of the second height difference D2. The change of the second height difference D2 may be derived from the dimensional tolerance between the heating elements HS1, HS2, or may be derived from the replacement of the heating elements HS1, HS2 with heating elements HS1, HS2 of different dimensions.

As shown in FIG. 9, FIG. 10, and FIG. 11, in the second embodiment, the heat conductor 110 includes at least two blocks 118, and the at least two blocks 118 respectively correspond to a contact plane S1, S2. The at least two blocks 118 are connected through a sliding guide structure 119, and the at least two blocks 118 can move relative to each other, causing the at least two contact planes S1, S2 to move relative to each other to change the first height difference D1, so that the first height difference D1 is capable to match the second height difference D2.

As shown in FIG. 9, FIG. 10, and FIG. 11, the at least two blocks 118 respectively have a joint surface 118a, two joint surfaces 118a are configured to be in contact with each other, and the joint surface 118a is approximately perpendicular to the contact planes S1, S2. The sliding guide structure 119 is a combination of a guide groove 119a and a guide rail 119b, and the guide groove 119a and the guide rail 119b are respectively disposed on two joint surfaces 118a. The directions in which the guide groove 119a and the guide rail 119b extend are perpendicular to the contact planes S1, S2. The guide rail 119b is slidably disposed in the guide groove 119a, so that the two joint surfaces 118a are at least partially in contact with each other, and the guide rail 119b and the guide groove 119a guide the two blocks 118 to move relative to each other, to change the first height difference D1.

As shown in FIG. 10 and FIG. 11, the heat dissipation device 100 of the second embodiment is also fixed by using a plurality of fixing members 120, and each of the blocks 118 is provided with a fixing through hole 112 for the fixing members 120 to pass through. The heat dissipation device 100 may further include a back plate 140. The back plate 140 is connected to the heat absorption side 110b through the plurality of fixing members 120, and back plate 140 is spaced apart from the heat absorption side 110b. The circuit board 200 and the heating elements HS1, HS2 are located between the back plate 140 and the heat absorption side 110b, so that the contact planes S1, S2 are pressed against the heating elements HS1, HS2 by clamping. In addition, the back plate 140 may be configured to reinforce the circuit board 200, to avoid bending and deformation of the circuit board 200.

Figure 12:
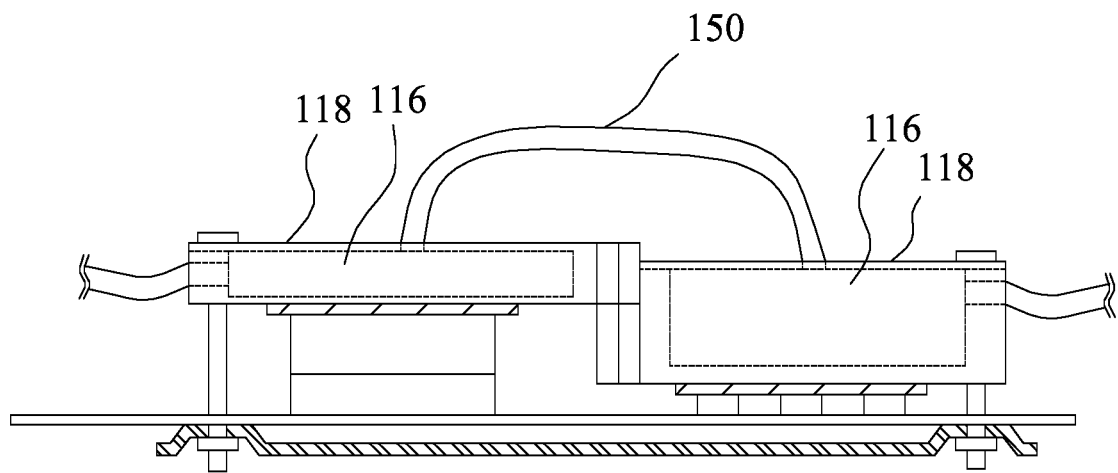
FIG. 12 and FIG. 13 are side views of a heat dissipation device and a circuit board according to a second embodiment of this disclosure, which reveal different variations.

As shown in FIG. 12, the at least two blocks 118 may be two water cooled heat sinks, that is, each of the blocks 118 has a cooling passage 116 therein. The cooling passage 116 between the at least two blocks 118 is connected to a pump by using at least one pipeline 150, so that the cooling liquid can circulate in the two blocks 118.

Figure 13:
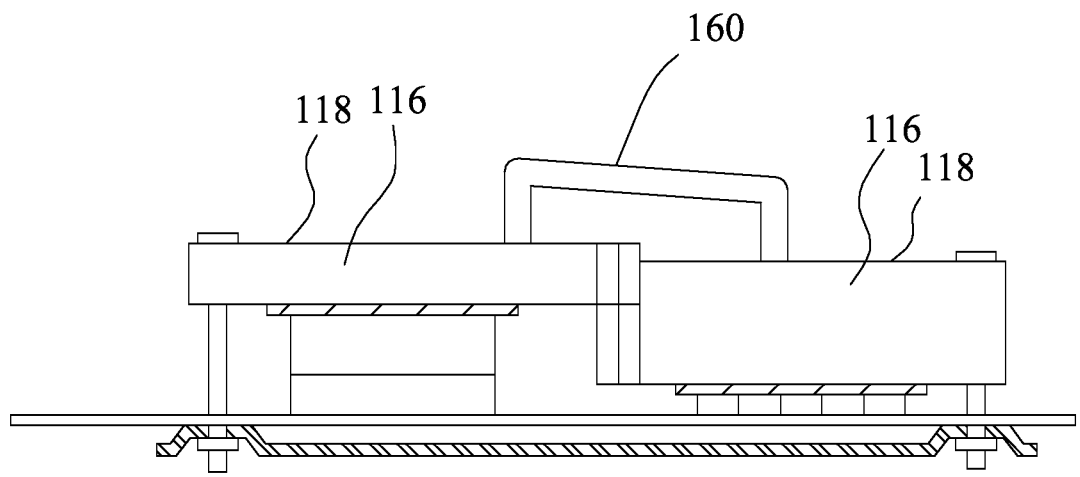

As shown in FIG. 13, in order to enhance the thermal equilibrium between the two blocks 118 and avoid the overheating of the corresponding block 118 caused by the excessive thermal power of the individual heating elements HS1, HS2, the heat dissipation device 100 further includes a heat-conducting member 160, for example, a heat pipe or a metal strip. Two ends of the heat-conducting member 160 are respectively connected to the two blocks 118, to transfer heat between the two blocks 118. The heat-conducting member 160 may be deformed appropriately to match the movement between the two blocks 118 relative to each other.

Figure 14:
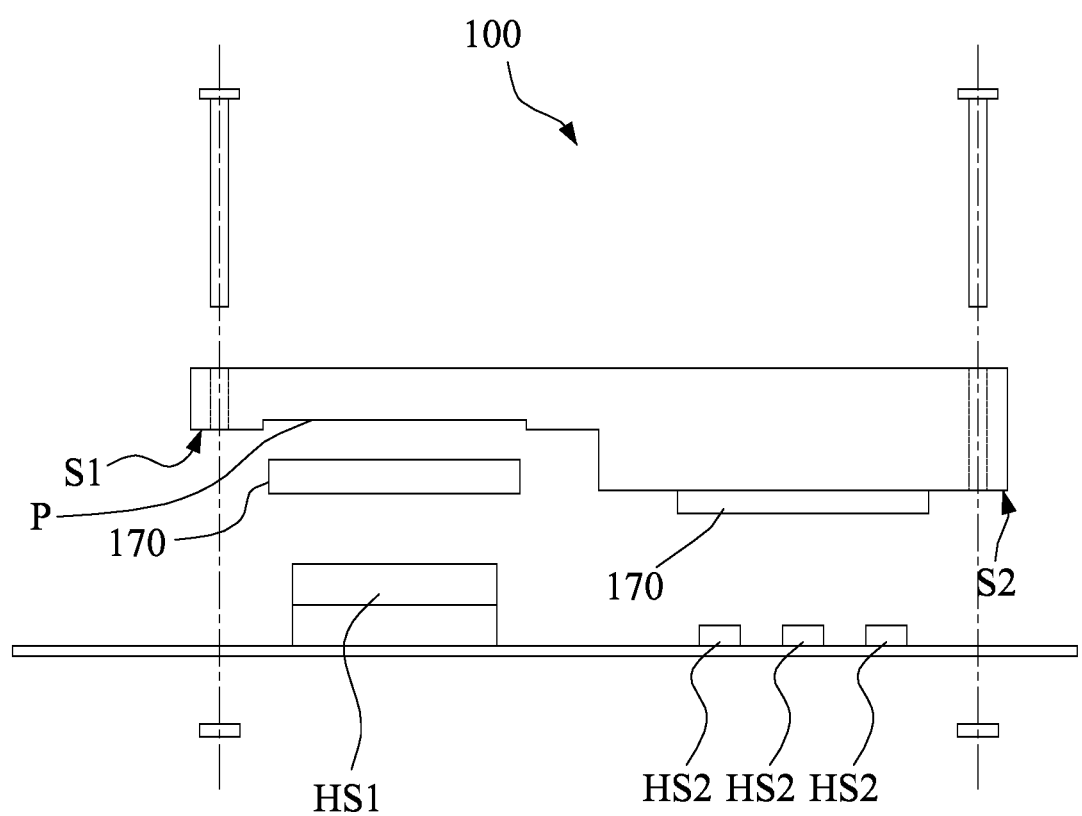
FIG. 14 is a side exploded view of a heat dissipation device and a circuit board according to a third embodiment of this disclosure.

As shown in FIG. 14, a heat dissipation device 100 disclosed in a third embodiment of this disclosure is shown. The heat dissipation device 100 of the third embodiment further includes two bumps 170. The two bumps 170 are respectively disposed on two contact planes S1, S2. At least one of the two bumps 170 is detachable. One of the at least two contact planes S1, S2 includes a positioning dent P configured to receive and position the detachable bump 170. The two bumps 170 are configured to be in contact with the heating elements HS1, HS2, so that the contact planes S1, S2 are indirectly connected to the heating elements HS1, HS2.

Figure 15:
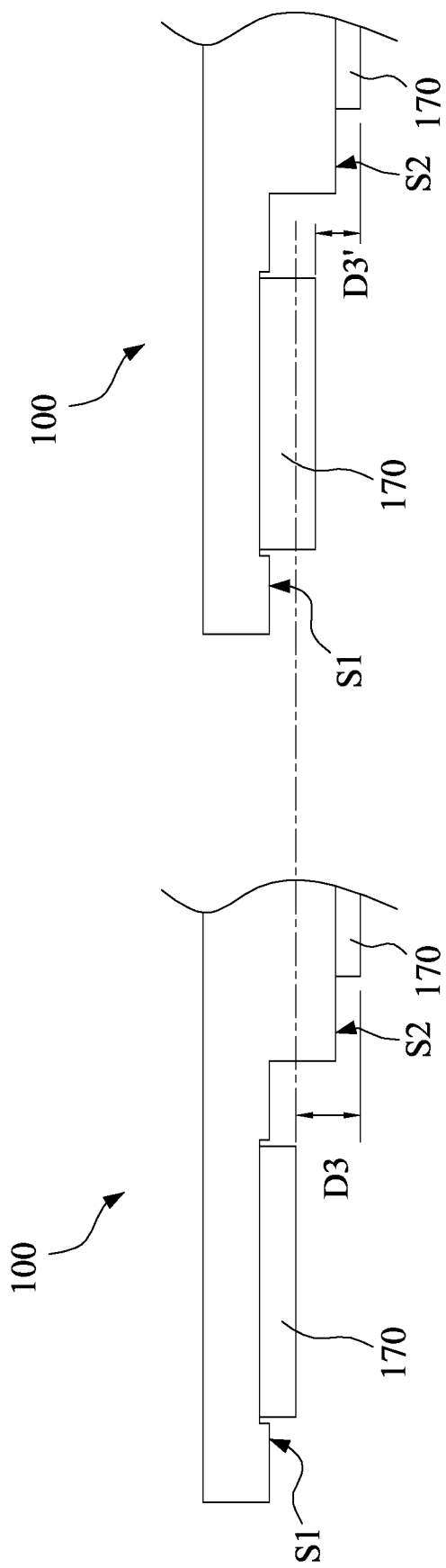
FIG. 15 is a partial side view of a heat dissipation device according to a third embodiment of this disclosure, which reveals different detachable bumps.

As shown in FIG. 15, a compensation height difference D3 is formed between the two bumps 170, and the compensation height difference D3 matches a second height difference D2 between the heating elements HS1, HS2. When the heating elements HS1, HS2 on the circuit board 200 change, and the second height difference D2 changes, the detachable bump 170 can be replaced by another detachable bump 170 to change the compensation height difference D3, so that a new compensation height difference D3' between the two bumps 170 can match the changed second height difference D2.

The heat sink of this disclosure has a plurality of contact planes of different heights, and may be respectively in contact with heating elements of different heights. Therefore, the heat sink of this disclosure can easily achieve the effect of heat dissipation by a plurality of heating elements at the same time. In at least one embodiment, according to this disclosure, through different structural changes, a first height difference between the contact planes and a second height difference between the heating elements are compensated, further solving the problem that the first height difference and the second height difference cannot be matched due to manufacturing tolerances or heating elements being replaced with heating elements of different specifications.

What is claimed is:

1. A heat dissipation device, comprising:
a heat conductor comprising a heat dissipation side and a heat absorption side opposite to each other, wherein the heat absorption side is formed by at least two contact planes, the at least two contact planes are parallel to each other, and a height difference exists between the at least two contact planes, wherein the at least two contact planes are capable to move relative to each other to change the height difference.

2. The heat dissipation device according to claim 1, further comprising a plurality of heat-conducting media respectively disposed on one of the at least two contact planes, and the plurality of heat-conducting media are deformable.

3. The heat dissipation device according to claim 1, further comprising a heat dissipation structure disposed on the heat dissipation side.

4. The heat dissipation device according to claim 3, wherein the heat dissipation structure is a water cooled heat sink, a plurality of heat dissipation fins, or a heat pipe.

5. The heat dissipation device according to claim 1, further comprising a heat pipe with one end of the heat pipe disposed in the heat conductor.

6. The heat dissipation device according to claim 1, wherein the heat conductor comprises at least two blocks, and the at least two blocks respectively correspond to one of the at least two contact planes, are connected through a sliding guide structure, and can move opposite to each other to change the height difference.

7. The heat dissipation device according to claim 6, wherein the at least two blocks respectively have a joint surface, the at least two joint surfaces are in contact with each other, the sliding guide structure is a combination of a guide groove and a guide rail, the guide groove and the guide rail are respectively disposed on each of the joint surfaces of the at least two blocks, and directions in which the guide groove and the guide rail extend are perpendicular to the at least two contact planes.

8. The heat dissipation device according to claim 6, wherein the at least two blocks are respectively a water block and are connected by at least a pipeline.

9. The heat dissipation device according to claim 6, further comprising a thermal conductive member, wherein two ends of the thermal conductive member are respectively connected to the at least two blocks.

10. The heat dissipation device according to claim 1, further comprising at least two bumps, wherein the at least two bumps are respectively disposed on the at least two contact planes, and at least one of the at least two bumps is removable.

11. The heat dissipation device according to claim 10, wherein one of the at least two contact planes has a positioning groove configured to position the removable bump.

12. The heat dissipation device according to claim 1, further comprising a plurality of fixing members passing through the heat conductor.

13. The heat dissipation device according to claim 1, further comprising a back plate and a plurality of fixing members, wherein the back plate is connected to the heat absorption side through the plurality of fixing members, and a distance is kept between the back plate and the heat absorption side.

* * * * *